(12) United States Patent
Ha et al.

(10) Patent No.: US 8,633,137 B2
(45) Date of Patent: Jan. 21, 2014

(54) HIGH-TEMPERATURE SUPERCONDUCTING TAPE

(75) Inventors: Hong Soo Ha, Changwon-si (KR); Sang Soo Oh, Changwon-si (KR); Ho Sup Kim, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 44 days.

(21) Appl. No.: 13/226,678

(22) Filed: Sep. 7, 2011

(65) Prior Publication Data

US 2012/0252680 A1 Oct. 4, 2012

(30) Foreign Application Priority Data

Mar. 31, 2011 (KR) ........................ 10-2011-0029468

(51) Int. Cl.
*H01L 39/24* (2006.01)
*H01B 12/00* (2006.01)

(52) U.S. Cl.
USPC ........... 505/239; 505/237; 505/238; 428/472; 428/701; 174/125.1

(58) Field of Classification Search
USPC ................ 505/230, 237–239, 704, 100, 150; 428/457, 472, 701, 930; 174/125.1; 29/599
See application file for complete search history.

(56) References Cited

U.S. PATENT DOCUMENTS

| | | | | |
|---|---|---|---|---|
| 4,994,435 A | * | 2/1991 | Shiga et al. | 505/232 |
| 5,019,555 A | * | 5/1991 | Chin et al. | 505/441 |
| 5,964,966 A | * | 10/1999 | Goyal et al. | 148/426 |
| 6,106,615 A | * | 8/2000 | Goyal et al. | 117/84 |
| 6,541,121 B2 | * | 4/2003 | Usoskin et al. | 428/469 |
| 2003/0036483 A1 | * | 2/2003 | Arendt et al. | 505/239 |
| 2003/0144150 A1 | * | 7/2003 | Arendt et al. | 505/237 |

OTHER PUBLICATIONS

JIS SUS310S Stainless steel, Data Sheet from U.S Cebon Steel Corp, 2012, http://www.316I-stainless.com/stainless-steel/JIS-SUS310S-stainless-steel.html.*

* cited by examiner

*Primary Examiner* — Stanley Silverman
*Assistant Examiner* — Kallambella Vijayakumar
(74) *Attorney, Agent, or Firm* — Park & Asscociates IP Law, P.C.

(57) ABSTRACT

Disclosed herein is a high-temperature superconducting tape, including: a substrate; a buffer layer formed on the substrate; and a high-temperature superconducting layer formed on the buffer layer, wherein the substrate is made of SUS310s or stainless steel containing 0.01-1% of silicon (Si) and 1-5% of molybdenum (Mo) and has an average metal crystal grain size of 12 μm or less, and the high-temperature superconducting layer is made of a ReBCO ($ReBa_2Cu_3O_7$, Re=Nd, Sm, Eu, Gd, Dy, Ho, Y)-based superconductive material. The high-temperature superconducting tape is advantageous with the result that a high-grade superconducting layer can be deposited on the thin buffer layer and thus the critical current density of the high-temperature superconducting tape can be improved, thereby remarkably improving the characteristics of the high-temperature superconducting tape.

14 Claims, 4 Drawing Sheets

(A) As-received    (B) After Electro polishing

HIGH-TEMPERATURE SUPERCONDUCTING TAPE

REFERENCE TO RELATED APPLICATIONS

This application claims the priority benefit of Korean Patent Application No. 10-2011-0029468 filed on Mar. 31, 2011, the entire contents of which are incorporated herein by reference.

FIELD OF THE INVENTION

The present invention relates to a high-temperature superconducting tape, and, more particularly, to a high-temperature superconducting tape, the critical current characteristics of which are improved because a stainless steel substrate, which is advantageous to electropolishing, is used and because of adjusting the composition ratio and crystal grain size of the stainless steel substrate.

BACKGROUND OF THE INVENTION

Generally, a high-temperature superconducting tape is manufactured by depositing a superconducting layer, such as YBCO, on a flexible metal substrate. When metal components of the metal substrate are diffused into the YBCO superconducting layer at high temperature (deposition temperature of YBCO) during the depositing process, the superconducting critical temperature and critical current density of YBCO tend to decrease, so that it is required to form a buffer layer, serving as a diffusion barrier, between the YBCO superconducting layer and the metal substrate.

Particularly, when nickel (Ni), which is contained in the metal substrate in large quantity, is diffused into YBCO lattices, the superconducting characteristics of YBCO are rapidly deteriorated, so that it is required to prevent nickel (Ni) from being diffused into the YBCO superconducting layer using the buffer layer formed between the metal substrate and the YBCO superconducting layer.

Generally, the buffer layer is formed between a metal substrate and a superconducting layer to chemically separate the superconducting layer from the metal substrate. Here, the buffer layer is formed of a plurality of layers (diffusion barrier layer/seed layer/IBAD template/homogeneous epitaxial buffer layer/lattice-matched buffer layer) which are used to induce YBCO to be biaxially oriented.

Conventionally, a diffusion barrier layer has been made of alumina ($Al_2O_3$). Such a diffusion barrier layer made of alumina is problematic in that, although the diffusion of metal components of a metal substrate into a superconducting layer can be prevented to some degree, the diffusion of the metal components into the superconducting layer with crystal grains cannot be completely prevented. Further, this diffusion barrier layer is problematic in that, since its surface roughness is not good, it is required to make a template relatively thick in order to deposit a high-grade superconducting layer on a metal substrate, and thus it takes a lot of time to manufacture a superconducting tape.

To date, in research into thin super conducting tapes, buffer layers have been intensively researched in order to improve the characteristics of the thin super conducting tapes. According to the results of research that have recently been published, such thin super conducting tapes having improved characteristics come close to being able to be commonly used, but the thickness of a template for manufacturing these thin super conducting tapes approximates to several micrometers. Therefore, there are problems in that the cost of fabricating the template increases, and in that the resulting superconducting tape is thick.

In order to solve the above problems, research into metal substrates has been widely carried out in addition to research into buffer layers. That is, in order to solve the problems of conventional nickel (Ni) substrates and hastelloy (nickel alloy) substrates widely used as a metal substrate, research has been done into stainless steel substrates.

According to the results of recent research, stainless steel substrates are advantageous compared to conventional hastelloy substrates in that they are cheaper than the hastelloy substrates by 1/10 or less and they exhibit nonmagnetic properties, and in that they are easily electropolished to have low surface roughness, thus decreasing the thickness of a buffer layer (template) necessary for depositing a high-grade superconducting layer on a metal substrate. Therefore, recently, the research into stainless steel substrates (U.S. Pat. No. 6,541,121 B2, EP0312015) has been actively done. However, there are also problems in that it is difficult to realize the common use of these stainless steel substrates because the critical current density and surface roughness improvements are falling short, and because the surface roughness of a silver (Ag) protection layer applied on a superconducting layer increases, so that the stainless steel substrate is damaged, thereby deteriorating the characteristics of a superconducting tape.

SUMMARY OF THE INVENTION

Accordingly, the present invention has been devised to solve the above-mentioned problems, and an object of the present invention is to provide a high-temperature superconducting tape, the critical current characteristics of which are improved because a stainless steel substrate, which is easily electropolished, is used and because of adjusting the composition ratio and crystal grain size of the stainless steel substrate.

In order to accomplish the above object, an aspect of the present invention provides a high-temperature superconducting tape, including: a substrate; a buffer layer formed on the substrate; and a high-temperature superconducting layer formed on the buffer layer, wherein the substrate is made of SUS310s or stainless steel containing 0.01-1% of silicon (Si) and 1-5% of molybdenum (Mo) and has an average metal crystal grain size of 12 μm or less, and the high-temperature superconducting layer is made of a ReBCO ($ReBa_2Cu_3O_7$, Re=Nd, Sm, Eu, Gd, Dy, Ho, Y)-based superconductive material.

Here, the buffer layer may be made of yttrium oxide ($Y_2O_3$)/magnesia (MgO)/lanthanum manganate ($LaMnO_3$) or alumina ($Al_2O_3$)/yttrium oxide ($Y_2O_3$)/magnesia (MgO)/ceria ($CeO_2$).

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
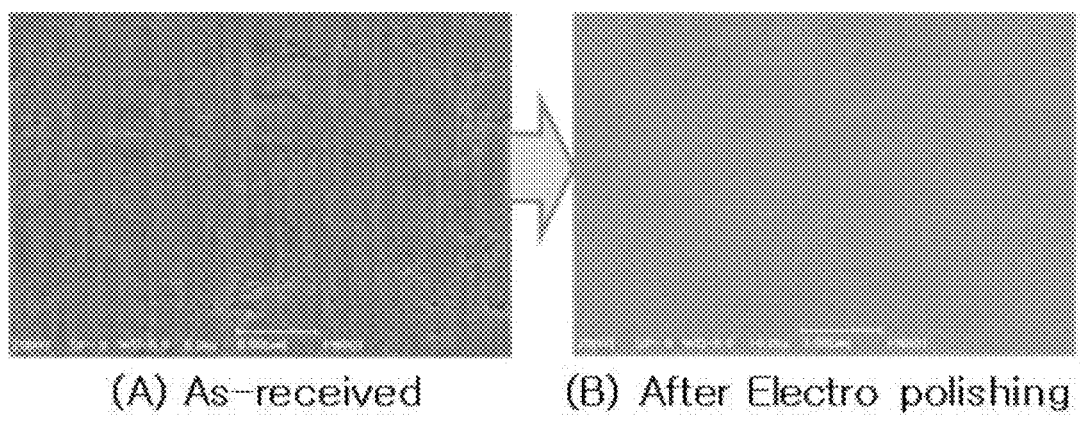
FIG. 1 shows electron microscope photographs of a substrate before and after electropolishing according to an embodiment of the present invention.

The present invention provides a high-temperature superconducting tape, including a substrate, a buffer layer formed on the substrate, and a high-temperature superconducting layer formed on the buffer layer. Here, the substrate is made of SUS310s or stainless steel containing 0.01-1% of silicon (Si) and 1-5% of molybdenum (Mo) and has an average metal crystal grain size of 12 μm or less, and the high-temperature superconducting layer is made of a ReBCO ($ReBa_2Cu_3O_7$, Re=Nd, Sm, Eu, Gd, Dy, Ho, Y)-based superconductive material.

In this case, the substrate exhibits nonmagnetic properties and is inexpensive compared to a conventional hastelloy substrate, and is easily electropolished compared to a conventional stainless steel substrate, so that the surface roughness thereof is low and thus the thickness of a buffer layer can be reduced, with the result that a high-grade superconducting layer can be deposited on the thin buffer layer and thus the critical current density of the high-temperature superconducting tape can be improved, thereby remarkably improving the characteristics of the high-temperature superconducting tape.

Hereinafter, preferred embodiments of the present invention will be described in detail with reference to the attached drawings.

In order to manufacture a high-temperature superconducting tape, first, a SUS310s substrate or a stainless steel substrate including or silicon (Si) 0.5%, molybdenum (Mo) 1%, iron (Fe) 50%, nickel (Ni) 18%, chromium (Cr) 24%, manganese (Mn) 1.5% and residual carbon (C), and having an average metal crystal grain size of 8 μm was used.

Among the components of the stainless steel substrate, the amount of silicon is 0.01-1% by weight based on the total amount of the stainless steel substrate. Here, when the amount of silicon is less than 0.01%, there is a problem in that a Fe—Cr compound for improving the strength of stainless steel is scarcely precipitated. Further, when the amount thereof is more than 1%, the Fe—Cr compound is excessively precipitated, there is a problem in that the substrate is difficult to be electropolished, and becomes brittle. Therefore, it is preferred that the amount of silicon be 0.01-1%, because the strength and electropolishing ability of the substrate are improved within this range. Meanwhile, when 1-5% of molybdenum is added, the formation rate of the Fe—Cr compound is adjusted, thus improving both the strength and electropolishing ability of the substrate.

Further, the average metal crystal grain size of the substrate must be 12 μm or less. When the average metal crystal grain size thereof is more than 12 μm, there is a problem in that the diffusion rate of the metal components of the substrate excessively increases. Therefore, the average metal crystal grain size thereof must be 12 μm or less. In this case, the average metal crystal grain size thereof can be adjusted by rolling and heat treatment. Further, when the average metal crystal grain size thereof is more than 12 μm, there are problems in that the high-temperature strength of the substrate is lowered, and in that the substrate is overetched during the electropolishing process.

The buffer layer, which is formed on the stainless steel substrate, is made of yttrium oxide ($Y_2O_3$)/magnesia (MgO)/lanthanum manganate ($LaMnO_3$) or alumina ($Al_2O_3$)/yttrium oxide ($Y_2O_3$)/magnesia (MgO)/ceria ($CeO_2$). In an embodiment of the present invention, the buffer layer made of alumina ($Al_2O_3$)/yttrium oxide ($Y_2O_3$)/magnesia (MgO)/ceria ($CeO_2$) was used, and this buffer layer can be formed by commonly-known thin-film deposition methods. In this embodiment, the buffer layer is formed to a thickness of 100 nm by electron beam deposition and sputtering.

The high-temperature superconducting layer is formed on the buffer layer, and is made of gadolinium barium copper oxide superconductor ($GdBa_2Cu_3O_7$, GBCO) or samarium barium copper oxide superconductor ($SmBa_2Cu_3O_7$, SmBCO). The high-temperature superconducting layer is formed to a thickness of 1-2 μm using co-evaporation.

FIG. 1 shows electron microscope photographs of a substrate before and after electropolishing according to an embodiment of the present invention. As shown in FIG. 1, since the substrate of the present invention is advantageous to electropolishing, the surface roughness of the substrate is improved, so that the thickness of the buffer layer and high-temperature superconducting layer sequentially formed on the substrate can be decreased, and the characteristics of the superconducting tape can be improved by improving the critical current density thereof.

Figure 2:
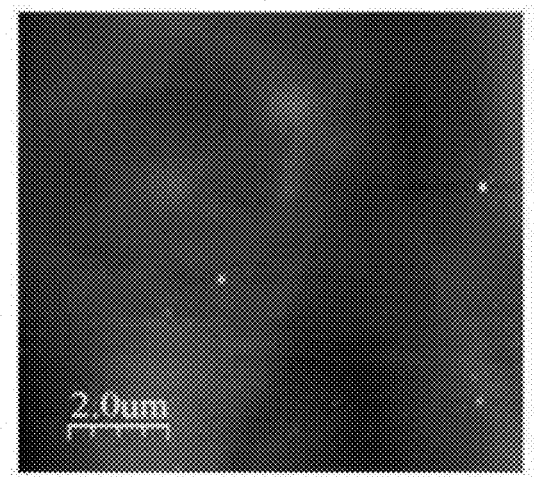
FIG. 2 is an electron microscope photograph showing the surface roughness of the substrate according to an embodiment of the present invention.

FIG. 2 is an electron microscope photograph showing the surface roughness of the substrate according to an embodiment of the present invention. As shown in FIG. 2, it can be ascertained that the average surface roughness of the substrate in the area of 10 μm×10 μm is 2.0 nm or less, and thus the substrate is advantageous to electropolishing. Most of conventional hastelloy substrates have a surface roughness of 2.0 nm due to grain-boundary products produced during electropolishing.

Figure 3:
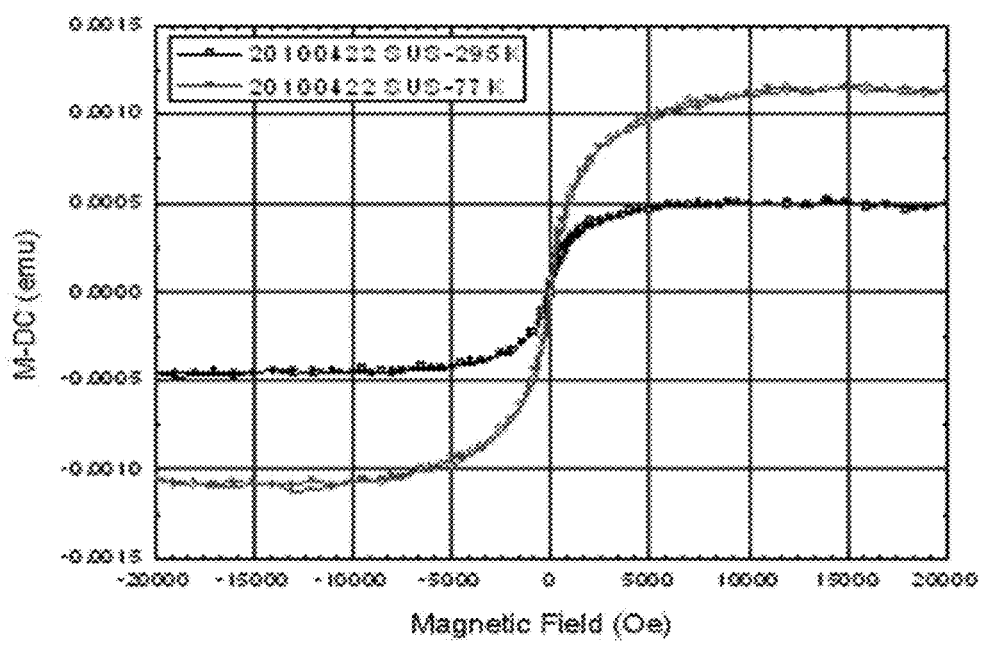
FIG. 3 is a graph showing the data about the magnetic properties of the substrate according to an embodiment of the present invention.
Figure 4:
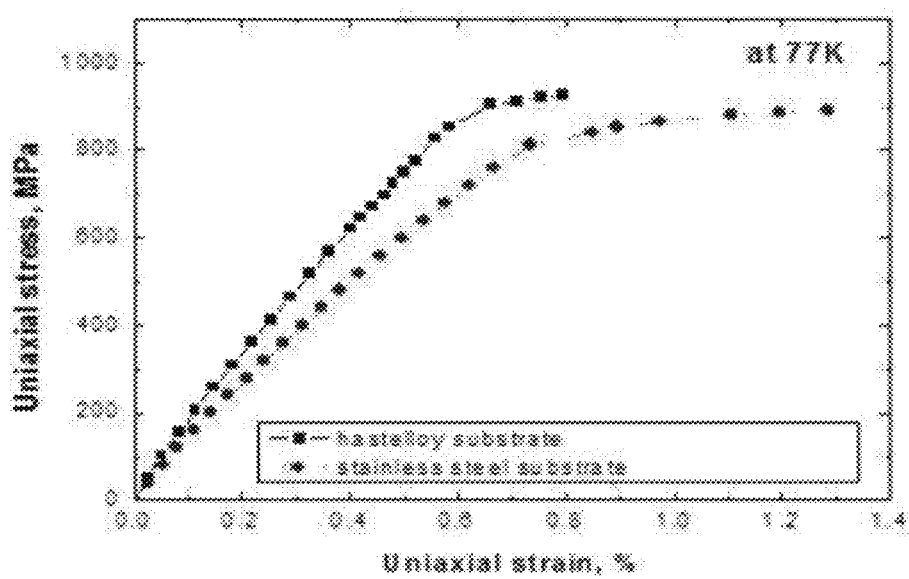
FIG. 4 is a graph showing the data about the physical properties of a high-temperature superconducting tape when a conventional hastelloy substrate was used and when the substrate according to an embodiment of the present invention was used (in this case, a high-temperature superconducting layer made of gadolinium barium copper oxide ($GdBa_2Cu_3O_7$, GBCO) was used)

FIG. 3 is a graph showing the data about the magnetic properties of the substrate according to an embodiment of the present invention. As shown in FIG. 3, it can be seen that the substrate nearly exhibit nonmagnetic properties at a temperature of 77K. FIG. 4 is a graph showing the data about the physical properties of a high-temperature superconducting tape when a conventional hastelloy substrate was used and when the substrate according to an embodiment of the present invention was used (in this case, a high-temperature superconducting layer made of gadolinium barium copper oxide ($GdBa_2Cu_3O_7$, GBCO) was used). As shown in FIG. 4, it can be seen that the elastic modulus of the high-temperature superconducting tape using the stainless steel substrate of the present invention at 77K is 143.6 GPa, and the elastic modulus of the high-temperature superconducting tape using the conventional hastelloy substrate at 77K is 114.3 GPa, and that both the yield strength of the substrate of the present invention and the yield strength of the conventional hastelloy substrate are 800 MPa or more. From the results, it can be ascertained that the magnetic and physical properties of the stainless steel substrate of the present invention are equal to or superior to those of the conventional hastelloy substrate, so that the stainless steel substrate of the present invention is sufficient for being used as an alternative to the conventional hastelloy substrate which is 10 times or more expensive compared to the stainless steel substrate.

Figure 5:
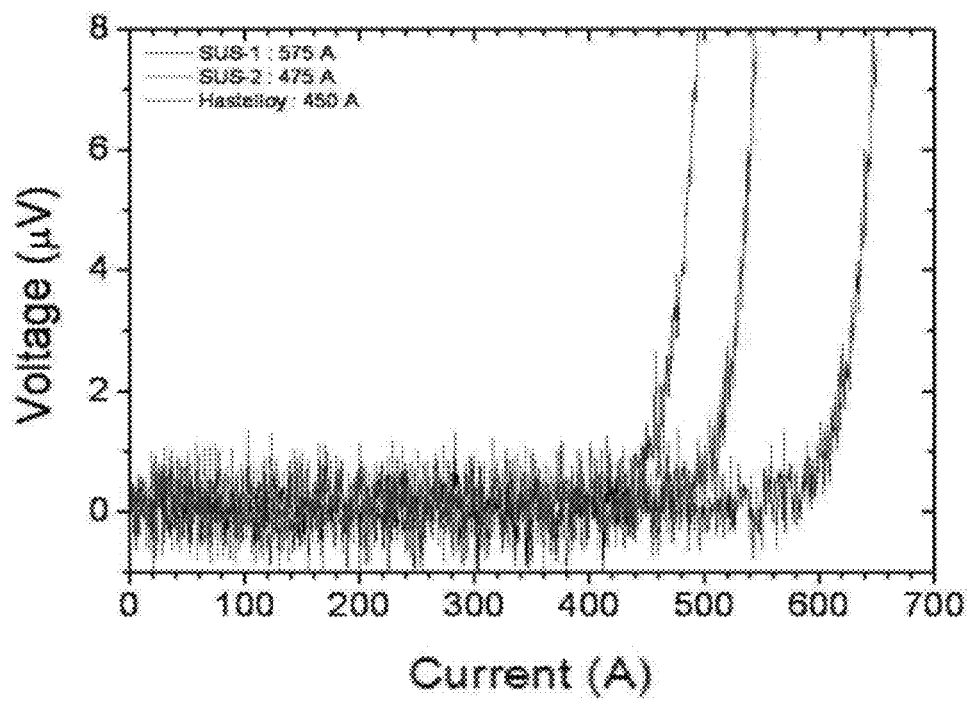
FIG. 5 is a graph showing the data about the critical current density of the high-temperature superconducting tape of the present invention (high-temperature superconducting tape of FIG. 4)

FIG. 5 is a graph showing the data about the critical current density of the high-temperature superconducting tape of the present invention (high-temperature superconducting tape of FIG. 4). From FIG. 5, it can be observed that the critical current density of the high-temperature superconducting tape using the stainless steel substrate of the present invention is similar to or higher than that of the high-temperature superconducting tape using the conventional hastelloy substrate. That is, when the conventional hastelloy substrate was used, the critical current density thereof was 450 A. When the stainless steel substrate of the present invention was used, the critical current density thereof was 575 A (a SUS310S substrate was used as the substrate, SUS 1) or 475 A (a stainless steel substrate including silicon (Si) 0.5%, molybdenum (Mo) 1%, iron (Fe) 50%, nickel (Ni) 18%, chromium (Cr) 24%, manganese (Mn) 1.5% and residual carbon (C), SUS 2). Consequently, it can be ascertained that the critical current density of the high-temperature superconducting tape using the stainless steel substrate of the present invention is superior to that of the high-temperature superconducting tape using the conventional hastelloy substrate.

Figure 6:
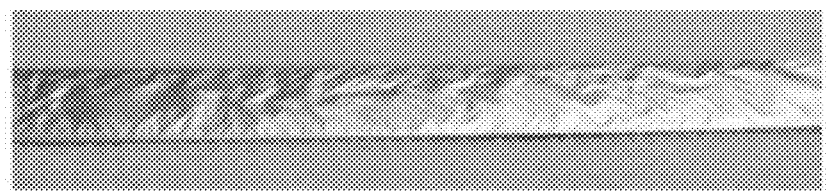
FIG. 6 is a photograph showing the state of the high-temperature superconducting tape when a conventional stainless steel substrate disclosed in U.S. Pat. No. 6,541,121 B2 was used.

FIG. 6 is a photograph showing the state of the conventional high-temperature superconducting tape which was manufactured by sequentially forming a buffer layer and a superconducting layer on a conventional stainless steel substrate disclosed in U.S. Pat. No. 6,541,121 B2 in the same manner as an embodiment of the present invention and then applying silver (Ag) thereonto to form a protective layer. As shown in FIG. 6, it can be ascertained that the surface roughness of this conventional high-temperature superconducting tape is higher than that of the high-temperature superconducting tape of the present invention, and, in this case, the silver (Ag) protective layer is easily damaged, thus deteriorating the overall characteristics of the high-temperature superconducting tape.

Like this, according to the high-temperature superconducting tape manufactured using the stainless steel substrate having the above-mentioned composition ratio and crystal grain size, since the stainless steel substrate is advantageous to electropolishing, the surface roughness thereof is lowered, so that the thickness of the buffer layer or superconducting layer can be reduced and the critical current density of the high-temperature superconducting tape can be improved, thereby improving the overall characteristics of the high-temperature superconducting tape and reducing the manufacturing cost of the high-temperature superconducting tape.

As described above, the high-temperature superconducting tape according to the present invention is advantageous in that a stainless steel substrate obtained by adjusting the composition ratio and metal grain size of the substrate exhibits nonmagnetic properties and is inexpensive compared to a conventional hastelloy substrate, and is easily electropolished compared to a conventional stainless steel substrate, so that the surface roughness thereof is low and thus the thickness of a buffer layer can be reduced, with the result that a high-grade superconducting layer can be deposited on the thin buffer layer and thus the critical current density of the high-temperature superconducting tape can be improved, thereby remarkably improving the characteristics of the high-temperature superconducting tape.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high-temperature superconducting tape, comprising:
   a substrate formed with a stainless steel containing 0.01-1% of silicon (Si) and 1-5% of molybdenum (Mo), each % amount of said elements being based on the total weight of the stainless steel forming the substrate;
   a buffer layer formed on the substrate; and
   a high-temperature superconducting layer formed on the buffer layer,
   wherein the substrate has an average metal crystal grain size of 12 μm or less, and wherein the high-temperature superconducting layer is made of a ReBCO-based superconductive material, in which "Re" is one element selected from the group consisting of Nd, Sm, Eu, Gd, Ho and Y.

2. The high-temperature superconducting tape of claim 1, wherein the buffer layer includes yttrium oxide ($Y_2O_3$), magnesia (MgO), and lanthanum manganate ($LaMnO_3$).

3. The high-temperature superconducting tape of claim 2, wherein the high-temperature superconducting layer has a thickness of 1-2 μm, and wherein said high-temperature superconducting layer is made of gadolinium barium copper oxide following a general formula $GdBa_2Cu_3O_7$.

4. The high-temperature superconducting tape of claim 2, wherein the high-temperature superconducting layer has a thickness of 1-2 μm, and wherein said high-temperature superconducting layer is made of samarium barium copper oxide following a general formula $SmBa_2Cu_3O_7$.

5. The high-temperature superconducting tape of claim 1, wherein the buffer layer includes alumina ($Al_2O_3$), yttrium oxide ($Y_2O_3$), magnesia (MgO), and ceria ($CeO_2$).

6. The high-temperature superconducting tape of claim 5, wherein the high-temperature superconducting layer has a thickness of 1-2 μm, and wherein said high-temperature superconducting layer is made of gadolinium barium copper oxide following a general formula $GdBa_2Cu_3O_7$.

7. The high-temperature superconducting tape of claim 5, wherein the high-temperature superconducting layer has a thickness of 1-2 μm, and wherein said high-temperature superconducting layer is made of samarium barium copper oxide following a general formula $SmBa_2Cu_3O_7$.

8. A high-temperature superconducting tape, comprising:
   a substrate formed with a stainless steel containing 0.5% of silicon (Si), 1% of molybdenum (Mo), 50% of iron (Fe), 18% of nickel (Ni), 24% of chromium (Cr), 1.5% of manganese (Mn) and residual carbon (C), in which each % amount of said elements being based on the total weight of the stainless steel forming the substrate;
   a buffer layer formed on the substrate; and
   a high-temperature superconducting layer formed on the buffer layer,
   wherein the substrate has an average metal crystal grain size of 8 μm, and wherein the high-temperature superconducting layer is made of a ReBCO-based superconductive material, in which "Re" is one element selected from the group consisting of Nd, Sm, Eu, Gd, Ho and Y.

9. The high-temperature superconducting tape of claim 8, wherein the buffer layer includes yttrium oxide ($Y_2O_3$), magnesia (MgO), and lanthanum manganate ($LaMnO_3$).

10. The high-temperature superconducting tape of claim 9, wherein the high-temperature superconducting layer has a thickness of 1-2 μm, and wherein said high-temperature superconducting layer is made of gadolinium barium copper oxide following a general formula $GdBa_2Cu_3O_7$.

11. The high-temperature superconducting tape of claim 9, wherein the high-temperature superconducting layer has a thickness of 1-2 μm, and wherein said high-temperature superconducting layer is made of samarium barium copper oxide following a general formula $SmBa_2Cu_3O_7$.

12. The high-temperature superconducting tape of claim 8, wherein the buffer layer includes alumina ($Al_2O_3$), yttrium oxide ($Y_2O_3$), magnesia (MgO), and ceria ($CeO_2$).

13. The high-temperature superconducting tape of claim 12, wherein the high-temperature superconducting layer has a thickness of 1-2 μm, and wherein said high-temperature superconducting layer is made of gadolinium barium copper oxide following a general formula $GdBa_2Cu_3O_7$.

14. The high-temperature superconducting tape of claim 12, wherein the high-temperature superconducting layer has a thickness of 1-2 μm, and wherein said high-temperature superconducting layer is made of samarium barium copper oxide following a general formula $SmBa_2Cu_3O_7$.

* * * * *